US012332203B2

(12) United States Patent
McKeehan et al.

(10) Patent No.: US 12,332,203 B2
(45) Date of Patent: Jun. 17, 2025

(54) MEDIA CONDUCTIVITY MEASUREMENT SYSTEM

(71) Applicant: Eastman Kodak Company, Rochester, NY (US)

(72) Inventors: Thomas W. McKeehan, Pittsford, NY (US); Gary A. Smith, Rochester, NY (US); Charles C. Marshall, Pittsford, NY (US); Wayne D. Martin, Penfield, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 288 days.

(21) Appl. No.: 17/960,888

(22) Filed: Oct. 6, 2022

(65) Prior Publication Data
US 2024/0118227 A1 Apr. 11, 2024

(51) Int. Cl.
*G01N 27/04* (2006.01)
(52) U.S. Cl.
CPC .................. *G01N 27/04* (2013.01)
(58) Field of Classification Search
CPC ....... G01R 27/04; G01N 27/041; G01N 27/04
USPC .............................. 324/500, 600, 76.11, 701
See application file for complete search history.

(56) References Cited

U.S. PATENT DOCUMENTS

| 9,085,464 | B2 | 7/2015 | Malecki et al. |
| 9,201,366 | B2 * | 12/2015 | Creteau .............. G03G 15/2064 |
| 10,007,218 | B2 * | 6/2018 | Suzuki ............... G03G 15/2028 |
| 10,509,351 | B2 * | 12/2019 | Kakigahara ............ G03G 15/50 |
| 2014/0199473 | A1 * | 7/2014 | Van Lammeren ... H05K 3/1275 118/202 |
| 2018/0079201 | A1 * | 3/2018 | Landa ..................... B41J 2/0057 |
| 2019/0242011 | A1 * | 8/2019 | Gertmann ............. C23C 14/547 |

(Continued)

FOREIGN PATENT DOCUMENTS

| CN | 201464560 | 5/2010 |
| CN | 101592688 | 7/2011 |
| CN | 112630534 | 4/2021 |

(Continued)

OTHER PUBLICATIONS

"EddyCus® TF map 5050 Series—Contactless Sheet Resistance, Metal Layer Thickness, Resistivity and Anisotropy Imaging Device," Suragus Sensors and Instruments, https://www.suragus.com/en/products/sheet-resistance/mapping-devices/eddycus-tf-map-5050/.

(Continued)

*Primary Examiner* — Raul J Rios Russo
*Assistant Examiner* — Trung Q Nguyen
(74) *Attorney, Agent, or Firm* — David A. Novais

(57) ABSTRACT

A system for measuring the conductivity of a flexible media positioned between a conductive backing and a conductive roller, wherein the conductive roller contacts the flexible media in a roller contact region. A pressure control mechanism presses the conductive roller against the second surface of the flexible media with a specified contact pressure, and a motion control system provide a relative motion between the conductive roller and the flexible media. A resistance measuring system connected to the conductive roller and the conductive backing measures the conductivity of the flexible media within the roller contact region. A data recording system records the measured conductivity of the media as a function of position.

16 Claims, 8 Drawing Sheets

(56) References Cited

U.S. PATENT DOCUMENTS

2022/0339927 A1* 10/2022 Landa .................... B41J 2/0057
2023/0345641 A1* 10/2023 Zhu ........................ B33Y 30/00

FOREIGN PATENT DOCUMENTS

| JP | 2000-155143 | 6/2000 |
| JP | 2000-241470 | 9/2000 |
| JP | 2004-045109 | 2/2004 |

OTHER PUBLICATIONS

"Automated resistivity measurement system," Labman Automation, https://www.labmanautomation.com/systems/automated-resistivity-measurement-system/.

* cited by examiner

MEDIA CONDUCTIVITY MEASUREMENT SYSTEM

FIELD OF THE INVENTION

This invention pertains to the field of conductivity measurement systems, and more particularly to a system for measuring the conductivity of a web of media.

BACKGROUND OF THE INVENTION

Resistance is an important electrical property of many electrical components. Today many electrical devices include components that are fabricated on sheets or webs of media. For example, devices such as solar cell, antennas and touch screens can be fabricated using roll-fed printed electronics manufacturing methods. Measurement of the resistivity, or equivalently the conductivity, of a sheet or web of flexible media is therefore an important attribute. Given that most electrical components fabricated on flexible media include patterns of different materials to provide the desired functionality, electrical properties such as resistivity need to be characterized as a function of position. Even within areas that should nominally be uniform, the resistance can vary from location to location as normal manufacturing variations occur.

FIG. 1 illustrates a conventional conductivity measurement system that can be used to measure the resistance of a flexible media 105. The system uses two probes 40, 41 that are connected to a resistance measuring system 140 using wires 143, 144. To measure the resistance of the media 105 at a particular spatial position, one probe 40 is placed in contact with a first surface 106 of the media 105, and the other probe 41 is place in contact with a second surface 107 of the media 105. The resulting resistance measurement will be characteristic of the particular spatial location where the probes contact the media. In order to quantify the performance as a function of position, multiple point measurements must be taken. The number of readings required will depend on the spatial resolution required, with wide or long media potentially requiring thousands of discrete point measurements. Dragging the probes 40, 41 across the surface of the media 105 would be likely to damage the surface of the media 105. Therefore, to characterize the resistance as a function of position it is necessary to repeatedly lift the probes 40, 41 and place them onto the surface in a new location. This makes it time consuming and impractical to measure the resistance at a large number of positions.

There remains a need for a method to efficiently and accurately characterize the resistance of sheets or webs of media as a function of position.

SUMMARY OF THE INVENTION

The present invention represents a system for measuring the conductivity of a flexible media, including:
 a conductive backing adapted to be positioned in contact with a first surface of the flexible media;
 a conductive roller adapted to contact a second surface of the flexible media in a roller contact region when the flexible media is positioned between the conductive roller and the conductive backing;
 a pressure control mechanism for pressing the conductive roller against the second surface of the flexible media with a specified contact pressure;
 a motion control system adapted to provide a relative motion between the conductive roller and the flexible media;
 a resistance measuring system electrically connected to the conductive roller and the conductive backing that measures the resistance of the flexible media within the roller contact region; and
 a data recording system for recording the measured resistance of the flexible media as a function of position as the motion control system provides the relative motion between the conductive roller and the flexible media.

This invention has the advantage that the larger roller contact area causes less media damage than single point contact systems.

It has the additional advantage that high spatial resolution can be achieved without the need to repeatedly retract lift and reposition the probes in a point measurement system. This also enables higher measurement speeds.

BRIEF DESCRIPTION OF THE DRAWINGS

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the elements of the invention is not limiting. It should be noted that, unless otherwise explicitly noted or required by context, the word "or" is used in this disclosure in a non-exclusive sense.

Figure 1:
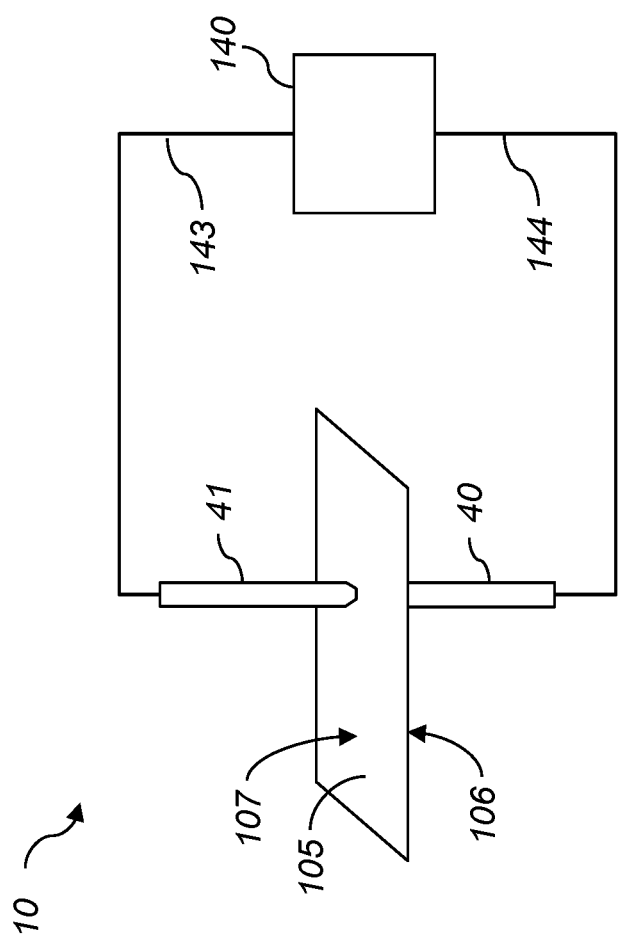
FIG. 1 illustrates a prior art conductivity measurement system.

This invention addresses the shortcomings of prior art conductivity measurement systems such as that shown in FIG. 1 which rely on discrete point measurement for sheets or webs of media 105 by utilizing a conductive roller that is moved across the surface of the media 105.

Figure 2:
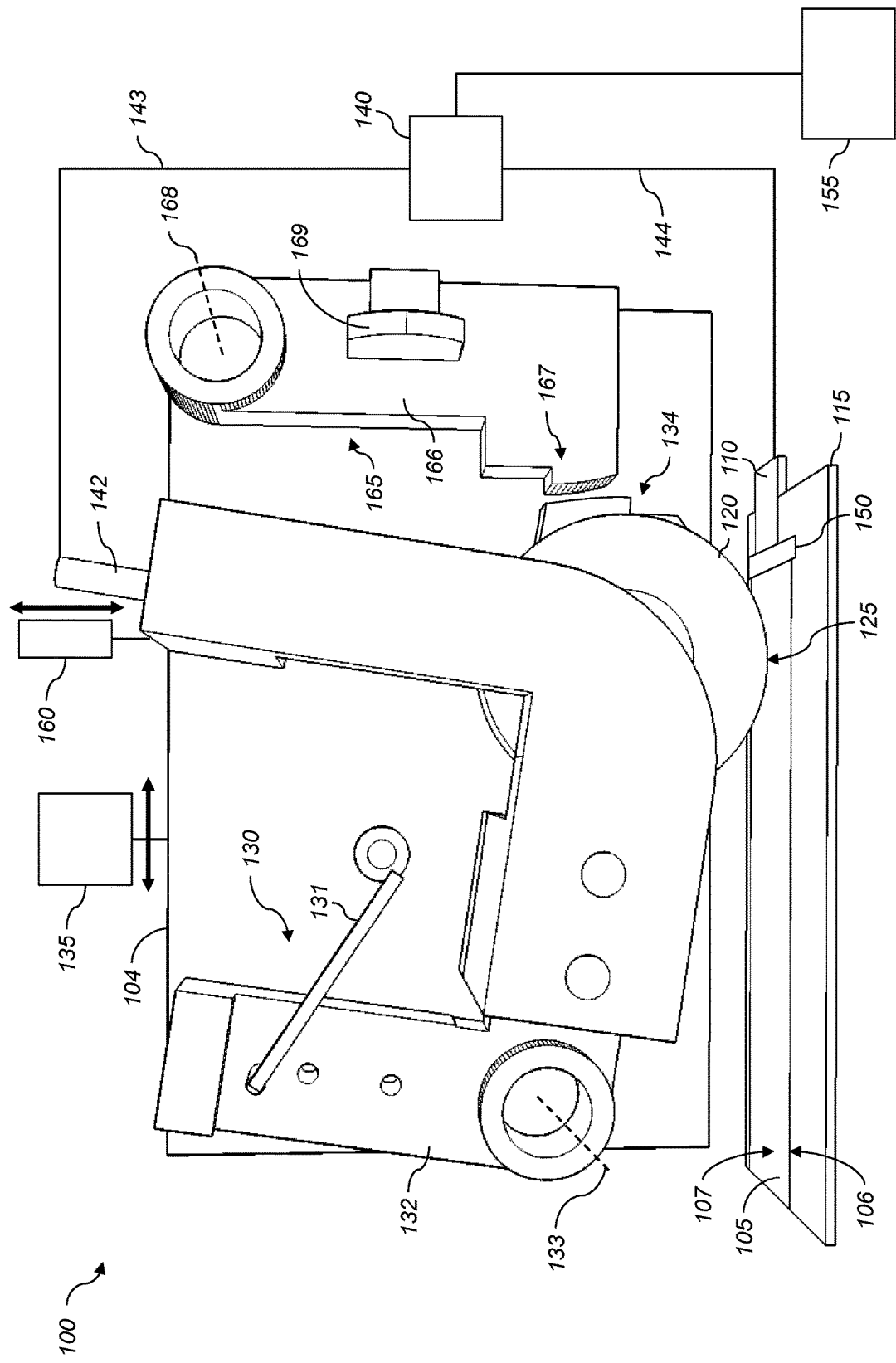
FIGS. 2-3 illustrate a conductivity measurement system in accordance with an exemplary embodiment.
Figure 3:
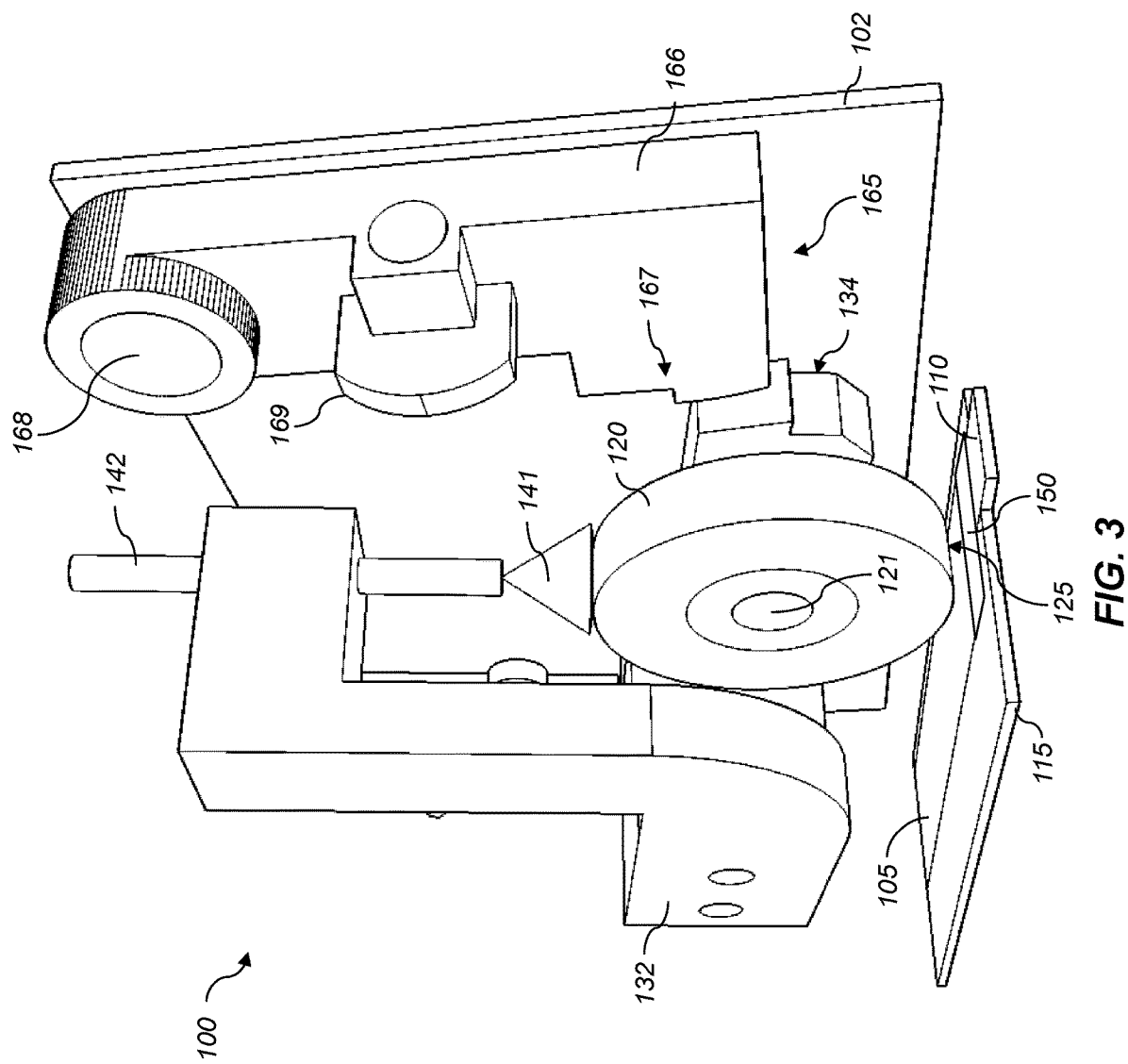

FIGS. 2 and 3 illustrate a front view and a perspective view, respectively, of a conductivity measurement system 100 in accordance with an exemplary embodiment of the present invention. The conductivity measurement system 100 measures the electrical conductivity (or equivalently the electrical resistance) of flexible media 105 as a function of spatial position. In some embodiments, the media 105 is a substrate, optionally having one or more coating layers applied to one or both surfaces.

The conductivity measurement system 100 is useful for printed electronics applications where the media 105 is used to form an electrical device, or a component of an electrical device (e.g., solar panels, EMI sheeting, transparent antennas, display screens, touch sensors, etc.). The term media 105 is sometimes referred to using terms such as "film," "substrate," "membrane," "sheet" or "receiver." In such cases, it is often important to characterize the electrical properties of the media 105, for example to provide quality control during a manufacturing process. For example, the media 105 can include layers of materials such as insulating materials, conducting materials and semi-conducting materials applied on an appropriate substrate such as plastic substrates (e.g., PET), paper substrates, glass substrates, or metal foils. The layers of material can be coated using any method known in the art and are typically patterned using various types of operations such as flexographic printing and photolithography in order to provide appropriate functions for the electrical device. In various applications, the media 105 may take different forms such as a web of media, or a sheet of media. It will be obvious to one skilled in the art that the conductivity measurement system 100 can be applied to any type of media 105 known in the art.

The conductivity measurement system 100 includes a conductive strip 110 positioned in contact with a first surface 106 of the media 105. In the illustrated embodiment, the conductive strip 110 is a rigid strip of metal affixed to a backing plate 115. In other embodiments, the conductive strip 110 can be a thin flexible sheet of metal affixed to the backing plate 115 using a flexible adhesive (e.g., an adhesive foam strip) so that it provides some cushioning and alignment for a conductive roller 120. A clamping mechanism 150 is used to secure a leading edge of the media 105 to the backing plate 115, enabling the media to stretch or move slightly during the measurement process.

The conductive roller 120 has a roller axis 121 (visible in FIG. 3) and contacts a second surface 107 of the media 105 in a roller contact region 125. In an exemplary embodiment, the conductive roller 120 is a chrome-plated bearing having a diameter of about 1 inch and a width of about ¼ inch. The roller contact region 125 will take the form of a thin line having a line length corresponding to a cross-track width of the conductive roller 120. The roller contact region 125 has a linear shape that will integrate the measurements in one axis (i.e., the cross-track direction), reducing test noise, while still detecting small features in the other axis (i.e., the in-track direction). The length of the roller contact region 125 can be controlled by selecting a conductive roller 120 having an appropriate width. For example, conductive rollers 120 could be used having cross-track widths in the range of ⅛-½ inch for various applications. Some types of media 105 may have characteristics that vary with orientation (optical differences, strength differences and electrical differences). In this case, the media 105 can be loaded into the conductivity measurement system 100 in different orientations so that the different axial conductivities can be characterized.

A pressure control mechanism 130 presses the conductive roller 120 against the second surface 107 of the media 105 with a constant contact pressure. In the illustrated embodiment, the pressure control mechanism 130 includes a spring 131 positioned to press the conductive roller 120 against the media 105. The spring 131 is connected between a frame 104 and a pivot arm 132 mounted on the frame 104, thereby applying a torque onto the pivot arm 132. The pivot arm 132 is adapted to pivot around a pivot axis 133, thereby transferring the torque provided by the spring 131 to a downward force on the conductive roller 120, which is also attached to the pivot arm 132. In other embodiments, any other type of pressure control mechanism known in the art can be utilized to provide a constant downward pressure on the conductive roller. Examples of other types of pressure control mechanisms would include a pneumatic or hydraulic mechanism, an electrical solenoid and a weighted arm.

A motion control system 135 moves the conductive roller 120 relative to the media 105, preferably at a constant velocity. In the illustrated embodiment, the media 105 is held in a constant position and the motion control system 135 is operationally associated with the frame 104 so that the frame 104 on which the conductive roller 120 is rotatably mounted is moved laterally. In other embodiments, the frame 104 can be held in a fixed position and the motion control system 135 is configured to move the media 105 past the conductive roller 120. The details of the motion control system 135 are not shown in FIG. 2 for simplicity. The motion control system 135 can include a linear drive mechanism controlled by a controller. In an exemplary configuration, the motion control system 135 uses a linear drive mechanism that includes a belt drive system using a belt and a motor to move the frame 104 and the connected components including the conductive roller 120 in a lateral direction down the length of the media 105. In other configurations, the motion control system 135 can utilize any other type of linear drive mechanism known in the art such as lead screw mechanisms, rack and pinion mechanisms, or hydraulic/pneumatic actuators.

A resistance measuring system 140 is connected to the conductive roller 120 and the conductive strip 110 that measures the resistance of the media 105 within the roller contact region 125. To connect the conductive roller 120 to the resistance measuring system 140, a reliable electrical contact needs to be made between the conductive roller 120 and a wire 143 connected to the resistance measuring system 140. In an exemplary configuration, a brush 141 (visible in FIG. 3) having metallic wires contacts the outer surface of the conductive roller 120. The use of the brush 141 eliminates the need to produce a conductive roller 120 with perfect conductivity through the hub. The brush 141 is attached to a conductive shaft 142, which is in turn connected to the wire 143. A second wire 144 connects the conductive strip 110 to the resistance measuring system 140. The brush 141 has the additional advantage of providing a cleaning function by brushing off any debris that may accumulate on the surface of the conductive roller 120

In an exemplary embodiment, the resistance measuring system 140 is a high-speed digital ohm meter providing the resistance measurement as the conductive roller 120 moves across the surface of the media 105. In an exemplary configuration, the resistance measuring system 140 is an Agilent 34410A Digital Multimeter configured to collect 20,000 resistance readings at 1000 samples/second and the motion control system 135 moves the conductive roller 120 at a velocity of 2 inches/second. This provides resistance measurements spanning 40 inches along the length of the media 105, spaced at 500 readings/inch (0.002 inches/datapoint). The sample spacing can be adjusted as needed for any application by adjusting either the reading rate or the transport speed. This enables the system to be customized according to the needs of a particular application, allowing very high resolution in areas of small features, and lower resolution in uniform areas.

A data recording system 155 is used to record the measured resistance of the flexible media as a function of position as the conductive roller 120 is moved across the second surface 107 of the media 105 by the motion control system 135. In an exemplary embodiment, the data recording system 155 stores the resistance measurements as an array of data values in a digital memory, or as a data file on a digital file system.

In the illustrated embodiment, the conductivity measurement system 100 further includes a lifting mechanism 160 adapted to lift the conductive roller 120 away from the second surface 107 of the media 105 after completing the measurement scan. The enables the media 105 to be loaded or unloaded from the conductivity measurement system 100. In an exemplary configuration, the conductivity measurement system 100 also includes a latch mechanism 165 to retain the conductive roller 120 in the lifted position. In the illustrated system, the latch mechanism 165 includes a latch arm 166 configured to pivot around a pivot axis 168. The latch arm 166 includes latch features 167 which engage with corresponding latch features 134 on the pivot arm 132. This type of latch mechanism 165 is similar to an escapement mechanism such as might be found in a mechanical clock. The illustrated latch mechanism 165 also includes a finger pull 169 that enables the latch mechanism 165 to be manually engaged or disengaged.

Figure 4:
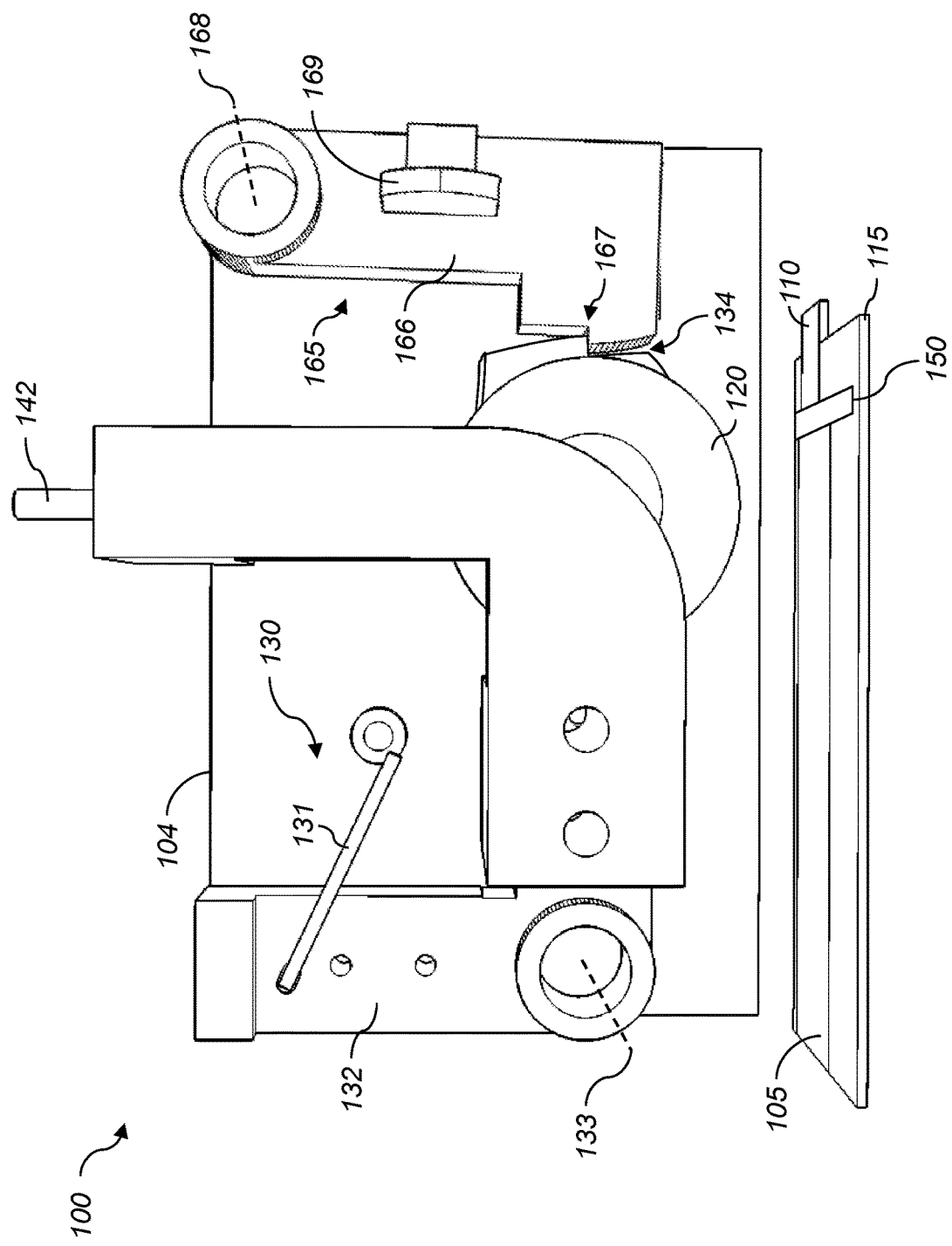
FIG. 4 shows the conductivity measurement system of FIG. 2 where the conductive roller is lifted away from the media.

The lifting mechanism 160 can utilize any type of mechanism known in the art to lift the conductive roller 120 away from the second surface 107 of the media 105. In an exemplary embodiment, the backing plate 115 can include a ramp at its trailing edge such that the conductive roller 120 rides up the ramp, causing the pivot arm 132 to pivot and lifting the conductive roller 120 to an elevated position. Preferably the latch arm 166 of the latch mechanism 165 is spring loaded so that it is pushed against the pivot arm 132. In this case, when the conductive roller 120 is lifted to a sufficient height, the latch features 167 of the latch arm 166 will automatically engage with the latch features 134 of the pivot arm 132, holding the conductive roller 120 in the elevated position as illustrated in FIG. 4. In other embodiments, the lifting mechanism 160 can utilize any type of mechanism known in the art to lift the conductive roller 120. For example, the lifting mechanism 160 can use a solenoid mechanism, a pneumatic or hydraulic mechanism, or a cam mechanism.

Figure 5B:
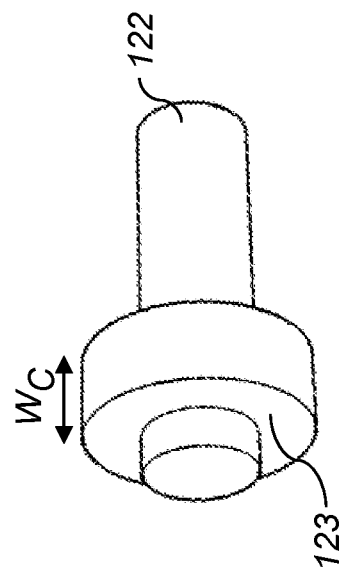
FIGS. 5A-5B show additional details of the conductive roller in the conductivity measurement system of FIG. 2.
Figure 5A:
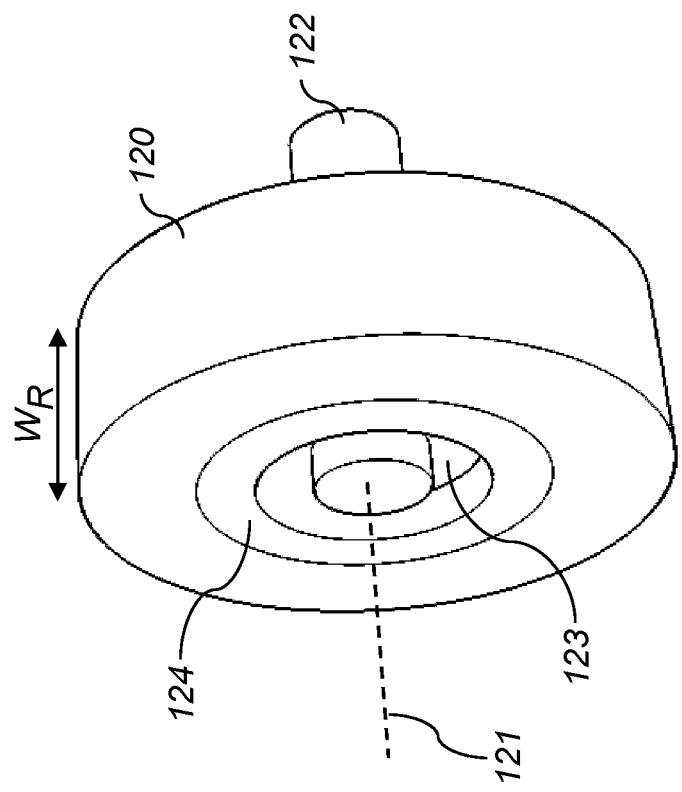

The conductive roller 120 should be positioned to contact the media 105 uniformly across the width of the roller face. In order to do that, the conductive roller 120 has to be perfectly aligned with the media 105. FIG. 5A illustrates a conductive roller 120 having self-aligning characteristics in accordance with an exemplary embodiment. The conductive roller 120 includes a bearing mounting 124 which enables the conductive roller 120 to freely rotate around the roller axis 121. The self-aligning characteristics are accomplished by adding a compliant ring 123 of a compliant material such as thin silicone tubing or rubber to a mounting bolt 122. The outer diameter of this compliant material will match the inner diameter of the bearing mounting 124 of the conductive roller 120, so it will effectively press into place. Additional details of the mounting bolt 122 and the compliant ring 123 are shown in FIG. 5B. The width $W_C$ of the compliant ring 123 is only a fraction (e.g., about 50%) of the roller width $W_R$, so that the force pressing down on the media 105 will be centered within the middle portion of the conductive roller 120. The combination of a compliant ring 123 and a centered force will produce the desired roller alignment with the surface of the media 105.

Figure 6:
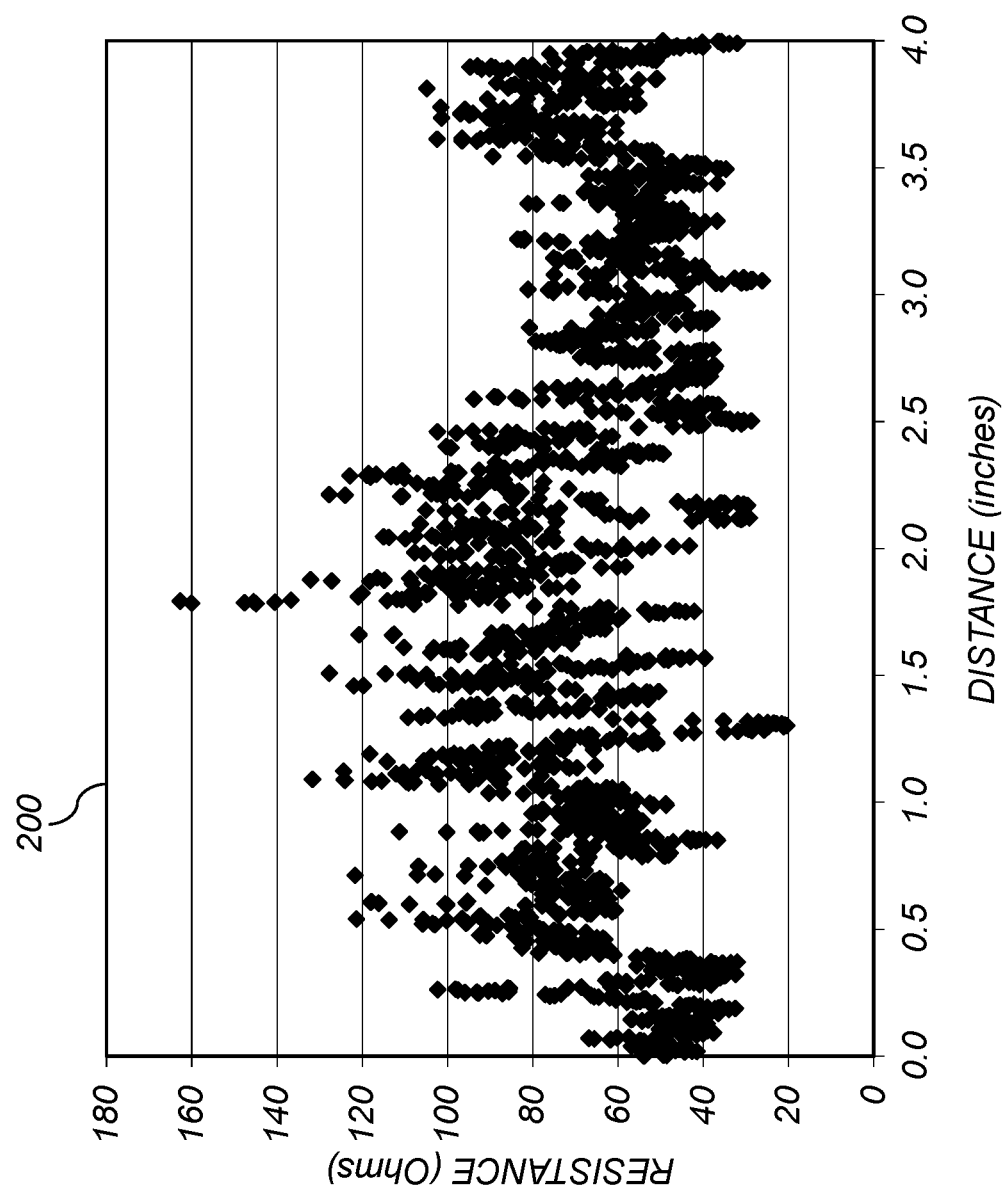
FIG. 6 is a graph showing exemplary resistance data measured using the conductivity measurement system of FIG. 2.

FIG. 6 shows a graph 200 displaying an exemplary set of conductivity data collected by the conductivity measurement system 100 where the media 105 is a partially-conductive film. It can be seen that the resistance varies significantly across what is nominally a uniform region of the media 105. The variability can correspond to microscopic variations in thickness or composition of the coating layers of the media 105. Some of the data spikes are only 10 points or less in width, indicating defects as small as 0.020 inches wide. This highlights the benefits of measuring the conductivity in a very small roller contact region 125. If a conventional conductivity measurement system 10 (FIG. 1) were used, it would typically not be able to detect these small features, both due to the larger contact region associated with typical probe diameters, and the fact that the system is not conducive to sampling the conductivity at a sequence of closely spaced positions.

The conductivity data can be processed, analyzed and displayed in various ways. For example, the conductivity data can be filtered and analyzed for averages, peaks, valleys and patterns. Measurement of conductivity over large areas with high resolution will allow small localized changes to be identified and their effects predicted on the electrical performance of an electrical device that is being fabricated.

Figure 7:
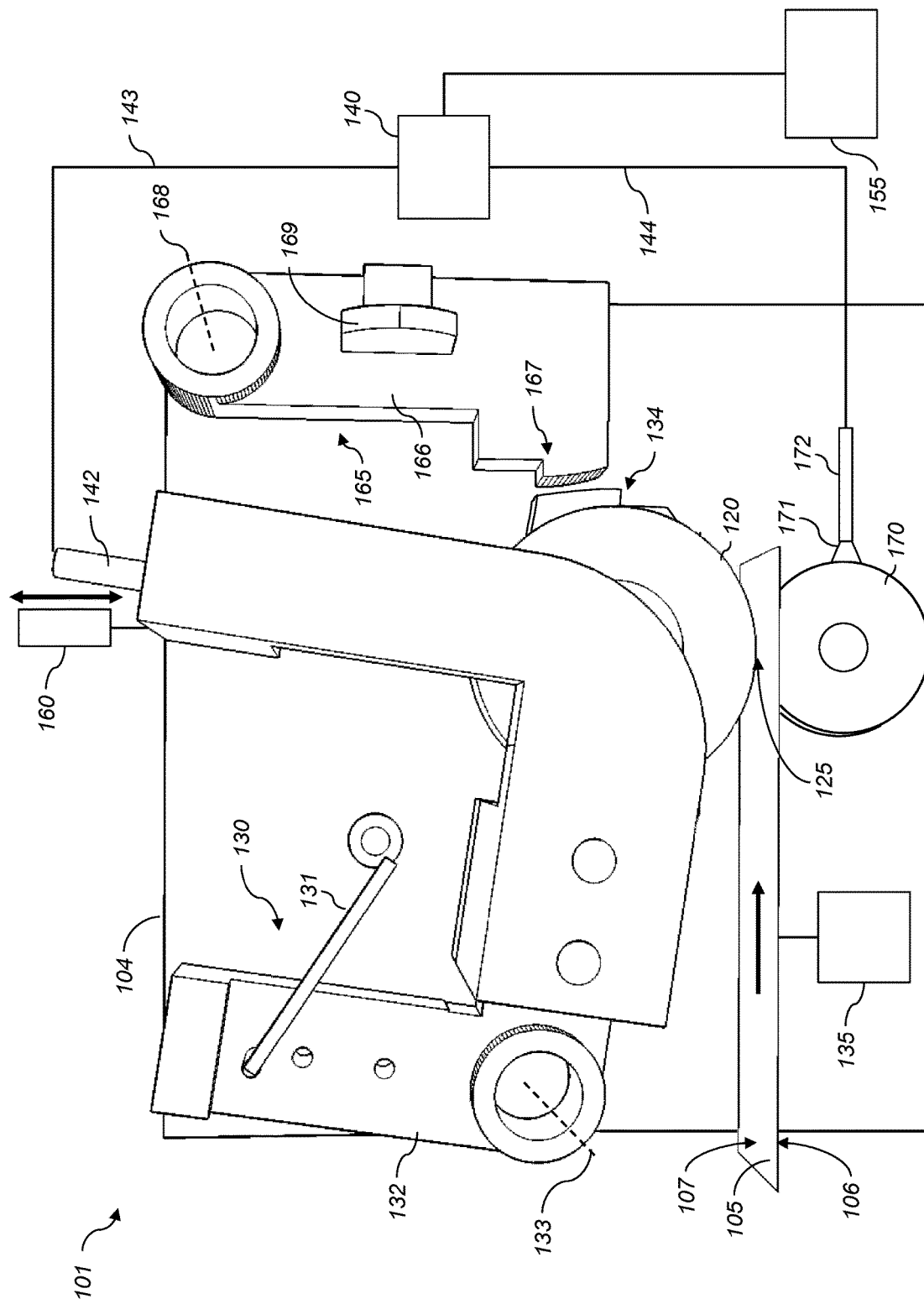
FIG. 7 illustrates a conductivity measurement system for webs of media in accordance with an alternate embodiment.

FIG. 7 illustrates an alternate embodiment of a conductivity measuring system 101 where the conductive backing is a conductive backing roller 170 rather than a conductive strip 110 (FIG. 1). The conductive backing roller 170 is mounted in a fixed position relative to the frame 104 so that the pressure control mechanism 130 causes the conductive roller 120 to be press the media 105 against the conductive backing roller 170. In some configurations, the conductive backing roller 170 can be mounted directly to frame 104 through known means such that the conductive roller 112 and the conductive backing roller 170 are both mounted to frame 104. Alternatively the conductive backing roller 170 can be mounted to a separate fixed member. A metallic brush 171 and a conductive shaft 172 is used to provide an electrical connection between the conductive backing roller 170 and the resistance measuring system 140. This configuration is particularly useful for web-based applications where it is desired to measure the conductivity of a web of media 105, for example as an in-line measurement during a web-based manufacturing process. In this case, the motion control system 135 controls the motion of the media 105 rather than the frame 104. For example, the motion control system 135 can be a web-transport system that transports the web of media 105 along a web-transport path at a constant velocity. This embodiment can also be used for sheets of media 105 where a sheet-based media transport system is used to move the sheets of media 105 through the nip between the conductive roller 120 and the conductive backing roller 170.

Figure 8:
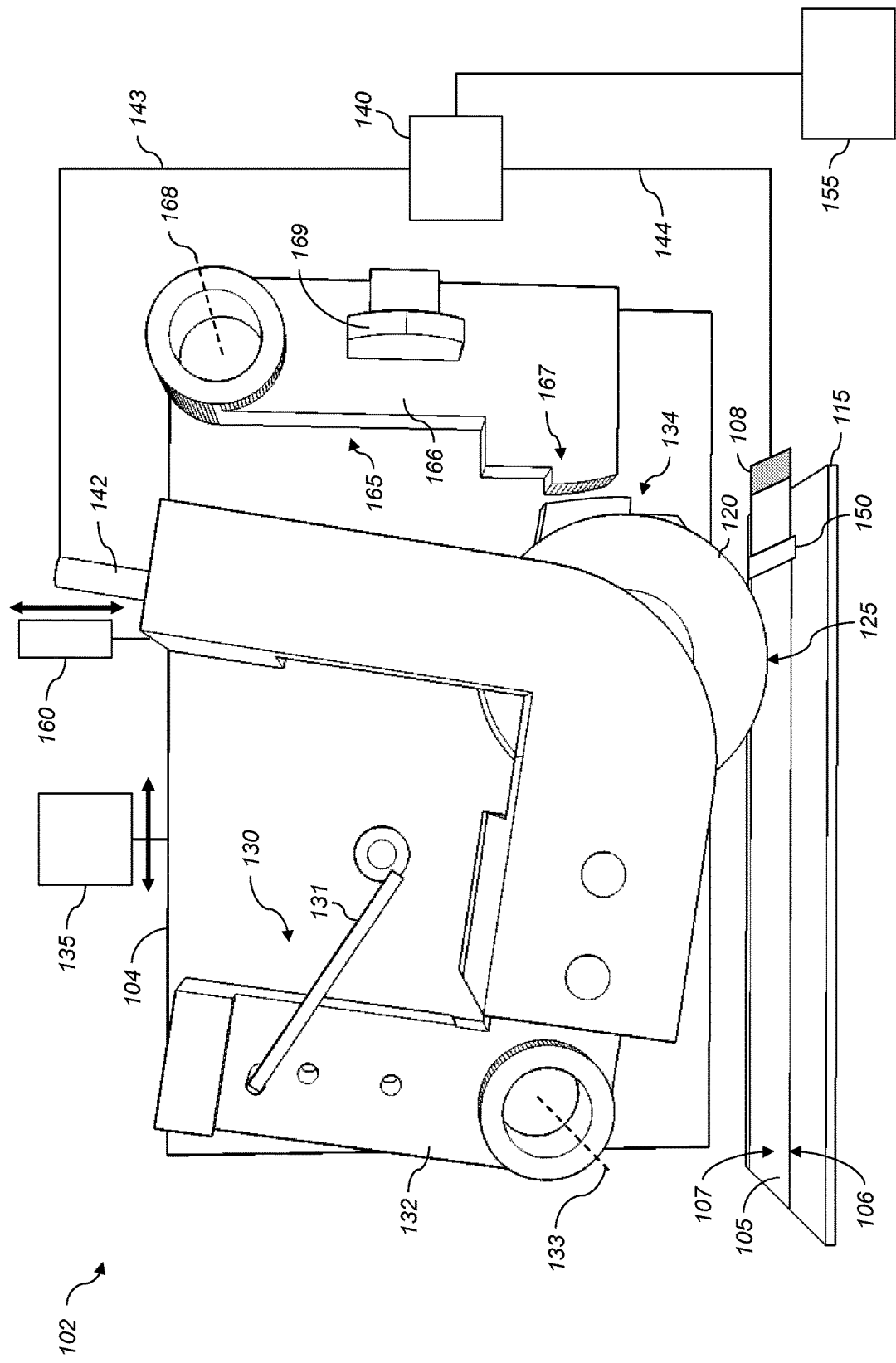
FIG. 8 illustrates a conductivity measurement system for media including a conductive layer in accordance with another alternate embodiment.

Some types of media 105 include a layer of conductive material such as a layer of metallic foil. For example, the metal foil can be used as a substrate upon which one or more layers of other materials can be applied. In such cases, it can be desirable to measure the conductivity characteristics of the layers that are above or below the layer of conductive material in the media 105. FIG. 8 illustrates an alternate embodiment of a conductivity measurement system 102 that is adapted for these types of conductivity measurements. In this case, the resistance measuring system 140 is connected to a conductive layer 108 of the media 105 rather than to a conductive backing. To make this connection, a portion of the conductive layer 108 needs to be accessible to make an electrical connection with the wire 143. The exposed portion of the conductive layer 108 could be a connection pad or a portion of the media 105 where no coatings were applied. The measured resistance values will correspond to the conductivity of the layers over the top of the conductive layer 108. The media 105 can be inverted to measure the conductivity of the layers on the other side of the conductive layer 108.

In addition to the conductivity characteristics of the media 105, it can sometimes be useful to characterize other media attributes such as the thickness. In some embodiments, a height gauge can be incorporated into the conductivity measurement system 100 in order to simultaneously measure the conductivity characteristics and the thickness characteristics, since there can be a relationship between the two measurements. For example, the conductivity measurement system 100 could also incorporate a linear variable displacement transducer (LVDT) vertical height gauge to measure media thickness while collecting conductivity. Such devices are well-known to those skilled in the art. In an exemplary configuration, an LVDT could be mounted to the top portion of the pivot arm 132 so that as the arm is rotated due to changes in the thickness of the media 105 it would compress the armature of the LVDT, thereby providing a signal indicating the thickness of the media 105.

The invention has been described in detail with particular reference to certain preferred embodiments thereof, but it will be understood that variations and modifications can be effected within the spirit and scope of the invention.

PARTS LIST 10 conductivity measurement system
40 probe
41 probe
100 conductivity measurement system
101 conductivity measurement system
102 conductivity measurement system
104 frame
105 media
106 first surface
107 second surface
108 conductive layer
110 conductive strip
115 backing plate
120 conductive roller
121 roller axis
122 mounting bolt
123 compliant ring
124 bearing mounting
125 roller contact region
130 pressure control mechanism
131 spring
132 pivot arm
133 pivot axis
134 latch features
135 motion control system
140 resistance measuring system
141 brush
142 shaft
143 wire
144 wire
150 clamping mechanism
155 data recording system
160 lifting mechanism
165 latch mechanism
166 latch arm
167 latch features
168 pivot axis
169 finger pull
170 conductive backing roller
171 brush
172 shaft
200 graph

The invention claimed is:

1. A system for measuring the conductivity of a flexible media, comprising:
    a conductive backing adapted to be positioned in contact with a first surface of the flexible media;
    a conductive roller adapted to contact a second surface of the flexible media in a roller contact region when the flexible media is positioned between the conductive roller and the conductive backing;
    a pressure control mechanism for pressing the conductive roller against the second surface of the flexible media with a specified contact pressure;
    a motion control system adapted to provide a relative motion between the conductive roller and the flexible media;
    a resistance measuring system electrically connected to the conductive roller and the conductive backing that measures an electrical resistance of the flexible media within the roller contact region; and
    a data recording system for recording the measured resistance of the flexible media as a function of position as the motion control system provides the relative motion between the conductive roller and the flexible media.

2. The system of claim 1, wherein the flexible media is a web of media.

3. The system of claim 1, wherein the flexible media is a sheet of media.

4. The system of claim 1, wherein the conductive backing is a rigid strip of metal or a thin sheet of metal affixed to a backing plate using a flexible adhesive.

5. The system of claim 4, wherein the motion control system moves the conductive roller laterally across the second surface of the flexible media.

6. The system of claim 1, wherein the conductive backing is a conductive backing roller, and wherein the conductive roller and the conductive backing roller are attached to a common frame.

7. The system of claim 6, wherein the motion control system moves the flexible media laterally between the conductive roller and the conductive backing roller.

8. The system of claim 1, wherein the pressure control mechanism includes a spring positioned to press the conductive roller against the flexible media.

9. The system of claim 8, wherein the conductive roller is attached to a pivot arm mounted on a frame, the pivot arm being adapted to pivot around a pivot axis, and wherein the spring is attached between the frame and the pivot arm thereby applying a torque on the pivot arm that causes the conductive roller to be pressed against the flexible media.

10. The system of claim 1, further including a lifting mechanism that lifts the conductive roller away from the second surface of the flexible media.

11. The system of claim 10, further including a latch mechanism which engages when the lifting mechanism lifts the conductive roller away from the second surface of the flexible media, wherein the latch mechanism holds the conductive roller in a lifted position.

12. The system of claim 1, wherein the electrical connection between the resistance measuring system and the conductive roller includes a metallic brush which is held in contact with an outer surface of the conductive roller.

13. The system of claim 1, wherein the conductive roller includes:
    a bearing mounting having a cylindrical inner surface; and
    a self-aligning mechanism that enables the conductive roller to tilt so that an outer surface of the conductive roller conforms to the second surface of the flexible media, the self-aligning mechanism including:
        a mounting bolt; and
        a compliant ring positioned around the mounting bolt;
    wherein an outer surface of the compliant ring contacts the cylindrical inner surface of the bearing mounting, and wherein a width of the compliant ring is less than a width of the conductive roller.

14. The system of claim 1, wherein the roller contact region defines a linear shape having a length that corresponds to a cross-track width of the conductive roller to enable resistance measurements in a cross-track direction.

15. A system for measuring the electrical conductivity of a flexible media including one or more layers of material disposed over a conductive layer, comprising:
    a backing adapted to be positioned in contact with a first surface of the flexible media;
    a conductive roller adapted to contact a second surface of the flexible media in a roller contact region when the flexible media is positioned between the conductive roller and the backing;
    a pressure control mechanism for pressing the conductive roller against the second surface of the flexible media with a specified contact pressure;
    a motion control system adapted to provide a relative motion between the conductive roller and the flexible media;
    a resistance measuring system electrically connected to the conductive roller and the conductive layer of the flexible media that measures the resistance of one or more layers of material disposed between the conductive layer in the flexible media and the second surface of the flexible media within the roller contact region; and
    a data recording system for recording the measured resistance of the flexible media as a function of position as the motion control system provides the relative motion between the conductive roller and the flexible media.

16. A method for measuring an electrical conductivity of a flexible media, comprising:
    positioning a conductive backing into contact with a first surface of the flexible media;
    moving a conductive roller into contact with a second surface of the flexible media in a roller contact region so that the flexible media is positioned between the conductive roller and the conductive backing;
    pressing the conductive roller against the second surface of the flexible media with a specified contact pressure;
    moving one of the conductive roller or the flexible media relative to the other of the conductive roller or the flexible media;
    electrically connecting a resistance measuring system to the conductive roller and the conductive backing;
    measuring a resistance of the flexible media within the roller contact region; and
    recording the measured resistance of the flexible media as a function of a position of the conductive roller relative to the second surface of the flexible media in response to the movement of the one of the conductive roller or the flexible media relative to the other of the conductive roller or the flexible media.

* * * * *